(12) United States Patent
Park et al.

(10) Patent No.: US 12,519,439 B2
(45) Date of Patent: Jan. 6, 2026

(54) DIFFERENTIAL AMPLIFIER AND METHOD FOR ENHANCING GAIN OF A DIFFERENTIAL AMPLIFIER

(71) Applicants: IMEC VZW, Leuven (BE); VRIJE UNIVERSITEIT BRUSSEL, Brussels (BE)

(72) Inventors: Sehoon Park, Heverlee (BE); Daewoong Park, Heverlee (BE); Pierre Wambacq, Groot-Bijgaarden (BE); Jan Craninckx, Boutersem (BE)

(73) Assignees: IMEC VZW, Leuven (BE); VRIJE UNIVERSITEIT BRUSSEL, Brussels (BE)

( * ) Notice: Subject to any disclaimer, the term of this patent is extended or adjusted under 35 U.S.C. 154(b) by 814 days.

(21) Appl. No.: 17/826,692

(22) Filed: May 27, 2022

(65) Prior Publication Data
US 2022/0385254 A1 Dec. 1, 2022

(30) Foreign Application Priority Data

May 28, 2021 (EP) .................................... 21176438

(51) Int. Cl.
| | |
|---|---|
| *H03G 3/30* | (2006.01) |
| *H03F 1/42* | (2006.01) |
| *H03F 3/45* | (2006.01) |

(52) U.S. Cl.
CPC .......... *H03G 3/30* (2013.01); *H03F 3/45475* (2013.01); *H03G 2201/103* (2013.01)

(58) Field of Classification Search
CPC H03G 3/30; H03G 2201/103; H03F 3/45475; H03F 3/45278; H03F 2200/36;
(Continued)

(56) References Cited

U.S. PATENT DOCUMENTS

| 8,786,330 B1 * | 7/2014 | Chakraborty .......... H03B 19/14 |
| | | 327/119 |
| 2006/0057990 A1 | 3/2006 | Behzad et al. |
| | (Continued) | |

FOREIGN PATENT DOCUMENTS

CN 111211745 A * 5/2020 ............... H03F 1/42

OTHER PUBLICATIONS

Extended European Search Report and Written Opinion, Application No. EP21176438.6, mailed Dec. 10, 2021, 14 pages.
(Continued)

*Primary Examiner* — Andrea Lindgren Baltzell
*Assistant Examiner* — Malane Lieng
(74) *Attorney, Agent, or Firm* — McDonnell Boehnen Hulbert & Berghoff LLP

(57) ABSTRACT

A differential amplifier is provided. The differential amplifier includes a first single-ended amplifying means including at least a first terminal and a second terminal, a second single-ended amplifying means including at least a first terminal and a second terminal, a first transmission line, and a second transmission line. In this context, the first terminal of the first single-ended amplifying means is connected to the second terminal of the second single-ended amplifying means via the first transmission line. In addition to this, the first terminal of the second single-ended amplifying means is connected to the second terminal of the first single-ended amplifying means via the second transmission line.

11 Claims, 11 Drawing Sheets

(58) Field of Classification Search
CPC ............ H03F 1/42; H03F 2203/45318; H03F 2203/45644

See application file for complete search history.

(56) References Cited

U.S. PATENT DOCUMENTS

| | | | | |
|---|---|---|---|---|
| 2012/0068769 | A1* | 3/2012 | Wang | H03F 3/45659 330/260 |
| 2013/0321080 | A1 | 12/2013 | Jahanian et al. | |
| 2017/0257067 | A1 | 9/2017 | Abe et al. | |
| 2018/0253642 | A1* | 9/2018 | Gokmen | G06N 3/084 |
| 2021/0135637 | A1* | 5/2021 | Kawasaki | H03F 3/60 |

OTHER PUBLICATIONS

Shafiullah, Yasir, Rehman Akbar, Mikko Hietanen, and Aarno Parssinen. "A Voltage Controlled Oscillator with Inductive Divider Design and Analysis at Frequencies Above 100 GHZ." In 2020 IEEE Nordic Circuits and Systems Conference (NorCAS), pp. 1-5. IEEE, 2020.

Park, Dae-Woong, Dzuhri Radityo Utomo, Bao Huu Lam, Sang-Gug Lee, and Jong-Phil Hong. "A 230-260-GHz Wideband and High-Gain Amplifier in 65-nm CMOS Based on Dual-Peak $ Gmax-Core." IEEE Journal of Solid-State Circuits 54, No. 6 (2019): 1613-1623.

Katayama, K., S. Amakawa, K. Takano, T. Yoshida, M. Fujishima, K. Hisamitsu, and H. Takatsuka. "An 80-106 GHz CMOS amplifier with 0.5 V supply voltage." In 2017 IEEE Radio Frequency Integrated Circuits Symposium (RFIC), pp. 308-311. IEEE, 2017.

Ding, Tuanjie, Fanyi Meng, Kaixue Ma, Shouxian Mou, and Shanshan Xu. "A 0.1 THz SiGe LNA with Novel Feedback Networks for Bandwidth Extension." In 2019 IEEE Asia-Pacific Microwave Conference (APMC), pp. 1685-1687. IEEE, 2019.

Utomo, Dzuhri Radityo. "Coupled Feedback Differential Amplifier as a High-Power Terahertz Amplifier." In 2020 12th International Conference on Information Technology and Electrical Engineering (ICITEE), pp. 74-79. IEEE, 2020.

* cited by examiner

DIFFERENTIAL AMPLIFIER AND METHOD FOR ENHANCING GAIN OF A DIFFERENTIAL AMPLIFIER

CROSS-REFERENCE TO RELATED APPLICATIONS

The present application is a non-provisional patent application claiming priority to European Patent Application No. 21176438.6, filed on May 28, 2021, the contents of which are hereby incorporated by reference.

FIELD OF THE DISCLOSURE

The disclosure relates to a differential amplifier, for example a differential amplifier exhibiting enhanced gain, and a method for enhancing gain of a differential amplifier.

BACKGROUND

Generally, in times of an increasing number of communication applications employing high frequencies over a broad bandwidth, there is a growing need of a differential amplifier, for example for ultra-broad band without gain drop, and a method for achieving enhanced gain of a differential amplifier in order to satisfy the requirements of such communication applications.

CN 111211745 A discloses a power amplifier comprising a differential common-source amplifier and two LC resonance circuits connected to the gate and drain ends of the differential common-source amplifier n a crossed mode. In accordance with the power amplifier, a double-peak $G_{max}$ curve is obtained through the resonance circuit and the equivalent neutralization capacitance effect of the resonance circuit at high frequency, the bandwidth of the amplifier is expanded, and the high-frequency gain is improved. However, due to the foregoing configuration, for example the LC resonance circuits, the enhanced gain can disadvantageously not be achieved over an ultra-broad band without gain drop.

SUMMARY

Accordingly, there is a potential benefit of the disclosure to provide a differential amplifier, for example a differential amplifier achieving enhanced gain over an ultra-broad band, and a method for achieving enhanced gain of a differential amplifier, for example a method for achieving enhanced gain of a differential amplifier over an ultra-broad band, thereby yielding a high accuracy and efficiency of amplification.

According to a first aspect of the disclosure, a differential amplifier is provided. The differential amplifier comprises a first single-ended amplifying means comprising at least a first terminal and a second terminal, a second single-ended amplifying means comprising at least a first terminal and a second terminal, a first transmission line, and a second transmission line. In this context, the first terminal of the first single-ended amplifying means is connected to the second terminal of the second single-ended amplifying means via the first transmission line. In addition to this, the first terminal of the second single-ended amplifying means is connected to the second terminal of the first single-ended amplifying means via the second transmission line.

For example, the enhanced gain can be achieved without gain drop over an ultra-broad frequency band, which, for instance, allows for amplifying in a particularly accurate and efficient manner.

It is noted that the corresponding algebraic sign of amplification with respect to the first single-ended amplifying means or the second single-ended amplifying means, respectively, may be negative.

In an example, the first terminal of the first single-ended amplifying means is an input and/or the second terminal of the first single-ended amplifying means is an output. Analogously, the first terminal of the second single-ended amplifying means may be an input and/or the second terminal of the second single-ended amplifying means may be an output.

According to a first implementation form of the first aspect of the disclosure, the differential amplifier further comprises a first capacitance, for example a first capacitor, wherein the first capacitance, the first capacitor, is inserted between the first terminal of the first single-ended amplifying means and the first transmission line in a serial manner or between the first transmission line and the second terminal of the second single-ended amplifying means in a serial manner.

In addition to this or as an alternative, the differential amplifier further comprises a second capacitance, a second capacitor, wherein the second capacitance, the second capacitor, is inserted between the first terminal of the second single-ended amplifying means and the second transmission line in a serial manner or between the second transmission line and the second terminal of the first single-ended amplifying means in a serial manner.

For example, efficiency of amplification can further be increased.

According to a further implementation form of the first aspect of the disclosure, the value of the first capacitance is between 50 femtofarads (fF) and 200 fF, for example between 100 fF and 150 fF, per millimeter of the length of the first transmission line. In addition to this or as an alternative, the value of the second capacitance can be between 50 fF and 200 fF, for example between 100 fF and 150 fF, per millimeter of the length of the second transmission line.

According to a second implementation form of the first aspect of the disclosure, the length of the first transmission line is between a twentieth and a quarter, for example between a fifteenth and a sixth, of the respective signal wavelength. In addition to this or as an alternative, the length of the second transmission line is between a twentieth and a quarter, for example between a fifteenth and a sixth, of the respective signal wavelength.

According to a further implementation form of the first aspect of the disclosure, the length of the first transmission line is at least 50 micrometers (μm), for example at least 100 μm. Additionally or alternatively, the length of the second transmission line is at least 50 μm, for example at least 100 μm.

According to a further implementation form of the first aspect of the disclosure, the value of the first capacitance is between one and three times, for example between 1.5 and 2.5 times, the value of the respective first-terminal-to-second-terminal capacitance of the first single-ended amplifying means. In addition to this or as an alternative, the value of the second capacitance is between one and three times, for example between 1.5 and 2.5 times, the value of the respective first-terminal-to-second-terminal capacitance of the second single-ended amplifying means.

It is noted that at least one, for example each, of the respective first-terminal-to-second-terminal capacitance of the first single-ended amplifying means and the respective first-terminal-to-second-terminal capacitance of the second single-ended amplifying means may be a parasitic capacitance.

According to a further implementation form of the first aspect of the disclosure, the differential amplifier further comprises a first passive element network, wherein the first passive element network is inserted between the first terminal of the first single-ended amplifying means and the first transmission line in a serial manner or, in the case that the first capacitance is present, between the first terminal of the first single-ended amplifying means and the first capacitance in a serial manner.

In addition to this or as an alternative, the differential amplifier further comprises a second passive element network, wherein the second passive element network is inserted between the first terminal of the second single-ended amplifying means and the second transmission line in a serial manner or, in the case that the second capacitance is present, between the first terminal of the second single-ended amplifying means and the second capacitance in a serial manner.

According to a further implementation form of the first aspect of the disclosure, the first passive network comprises or is a first inductance, a first inductor. Additionally or alternatively, the second passive network comprises or is a second inductance, a second inductor.

According to a further implementation form of the first aspect of the disclosure, the differential amplifier further comprises a third passive element network, wherein the third passive element network is inserted between the second terminal of the first single-ended amplifying means and the second transmission line in a serial manner or, in the case that a capacitance, for example the above-mentioned second capacitance, is present, between the second terminal of the first single-ended amplifying means and the second capacitance in a serial manner.

In addition to this or as an alternative, the differential amplifier further comprises a fourth passive element network, wherein the fourth passive element network is inserted between the second terminal of the second single-ended amplifying means and the first transmission line in a serial manner or, in the case that a capacitance, for example the above-mentioned first capacitance, is present, between the second terminal of the second single-ended amplifying means and the first capacitance in a serial manner.

According to a further implementation form of the first aspect of the disclosure, the third passive network comprises or is a third inductance, a third inductor. Additionally or alternatively, the fourth passive network comprises or is a fourth inductance, a fourth inductor.

According to a further implementation form of the first aspect of the disclosure, the first single-ended amplifying means comprises or is a first transistor, wherein the first terminal of the first single-ended amplifying means is connected or equal to a gate terminal of the first transistor and the second terminal of the first single-ended amplifying means is connected or equal to a drain terminal of the first transistor.

In addition to this or as an alternative, the second single-ended amplifying means comprises or is a second transistor, wherein the first terminal of the second single-ended amplifying means is connected or equal to a gate terminal of the second transistor and the second terminal of the second single-ended amplifying means is connected or equal to a drain terminal of the second transistor.

Before the second aspect of the disclosure and its implementation forms are described in the following, it is noted that all the examples mentioned above analogously apply for the method explained below. It is further noted that specific values and/or configurations with respect to the first aspect of the disclosure analogously apply for the second aspect.

According to a second aspect of the disclosure, a method for achieving enhanced gain of a differential amplifier is provided. The method comprises the steps of providing a first single-ended amplifying means comprising at least a first terminal and a second terminal, a second single-ended amplifying means comprising at least a first terminal and a second terminal, a first transmission line, and a second transmission line, connecting the first terminal of the first single-ended amplifying means to the second terminal of the second single-ended amplifying means via the first transmission line, and connecting the first terminal of the second single-ended amplifying means to the second terminal of the first single-ended amplifying means via the second transmission line.

According to a first implementation form of the second aspect of the disclosure, the method further comprises the step of inserting a first capacitance, a first capacitor, between the first terminal of the first single-ended amplifying means and the first transmission line in a serial manner or between the first transmission line and the second terminal of the second single-ended amplifying means in a serial manner.

In addition to this or as an alternative, the method further comprises the step of inserting a second capacitance, a second capacitor, between the first terminal of the second single-ended amplifying means and the second transmission line in a serial manner or between the second transmission line and the second terminal of the first single-ended amplifying means in a serial manner.

According to a second implementation form of the second aspect of the disclosure, the method further comprises the step of tracking the corresponding stability factor with respect to the differential amplifier.

According to a further implementation form of the second aspect of the disclosure, the method further comprises the step of configuring the corresponding coupling between the first terminal of the first single-ended amplifying means of the differential amplifier and the second terminal of the second single-ended amplifying means of the differential amplifier such that the corresponding stability factor with respect to the differential amplifier is constantly nearly one, for example constantly one, for example constantly nearly one over a desired frequency range, for example constantly one over a desired frequency range, in the case of tracking the corresponding stability factor, on the basis of the tracked stability factor.

In addition to this or as an alternative, the method further comprises the step of configuring the corresponding coupling between the first terminal of the second single-ended amplifying means of the differential amplifier and the second terminal of the first single-ended amplifying means of the differential amplifier such that the corresponding stability factor with respect to the differential amplifier is constantly nearly one, for example constantly one, more for example constantly nearly one over a desired frequency range, for example constantly one over a desired frequency range, in the case of tracking the corresponding stability factor, on the basis of the tracked stability factor.

According to a further implementation form of the second aspect of the disclosure, the method further comprises the step of inserting a first passive element network between the first terminal of the first single-ended amplifying means and the first transmission line in a serial manner or, in the case that the first capacitance is present, between the first terminal of the first single-ended amplifying means and the first capacitance in a serial manner.

In addition to this or as an alternative, the method further comprises the step of inserting a second passive element network between the first terminal of the second single-ended amplifying means and the second transmission line in a serial manner or, in the case that the second capacitance is present, between the first terminal of the second single-ended amplifying means and the second capacitance in a serial manner.

According to a further implementation form of the second aspect of the disclosure, the method further comprises the step of inserting a third passive element network between the second terminal of the first single-ended amplifying means and the second transmission line in a serial manner or, in the case that a capacitance, the above-mentioned second capacitance, is present, between the second terminal of the first single-ended amplifying means and the second capacitance in a serial manner.

In addition to this or as an alternative, the method further comprises the step of inserting a fourth passive element network between the second terminal of the second single-ended amplifying means and the first transmission line in a serial manner or, in the case that a capacitance, the above-mentioned first capacitance, is present, between the second terminal of the second single-ended amplifying means and the first capacitance in a serial manner.

BRIEF DESCRIPTION OF THE FIGURES

The above, as well as additional, features will be better understood through the following illustrative and non-limiting detailed description of example embodiments, with reference to the appended drawings.

Exemplary embodiments of the disclosure are now further explained with respect to the drawings by way of example only, and not for limitation. In the drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
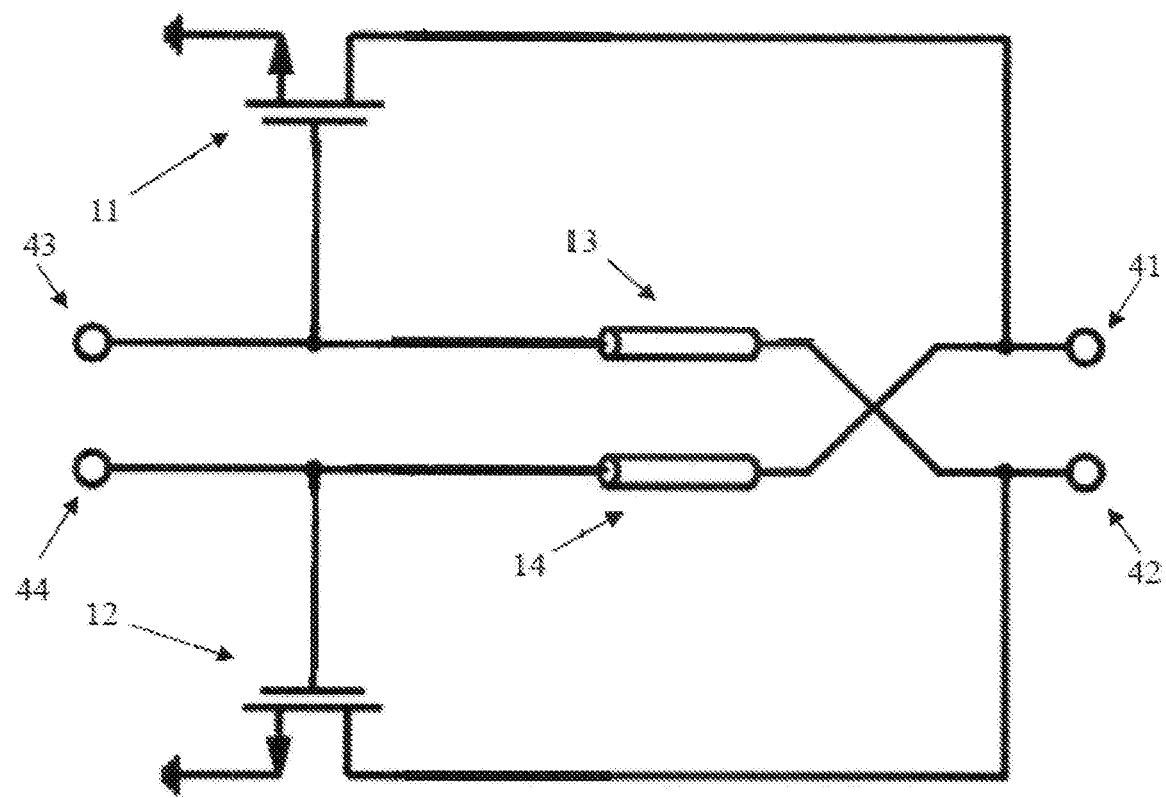
FIG. 1 shows a differential amplifier comprising capacitors in series with corresponding transmission lines, according to an example.

FIG. 1 is a block diagram of a differential amplifier or the core thereof, for example the $G_{max}$-core thereof. According to FIG. 1, the differential amplifier comprises a first transistor 11, a second transistor 12, a first transmission line 13, and a second transmission line 14.

In this context, a gate terminal of the first transistor 11 is connected to a drain terminal of the second transistor 12 via the first transmission line 13. Additionally, a gate terminal of the second transistor 12 is connected to a drain terminal of the first transistor 11 via the second transmission line 14.

The circuit diagram according to FIG. 1, for example the depicted connections thereof, can be summarized as follows: The gate terminal of the first transistor 11 is connected to a first terminal of the first transmission line 13, whereas a second terminal of the first transmission line 13 is connected to the drain terminal of the second transistor 12. By analogy therewith, the gate terminal of the second transistor 12 is connected to a first terminal of the second transmission line 14, whereas a second terminal of the second transmission line 14 is connected to the drain terminal of the first transistor 11.

Furthermore, the second terminal of the second transmission line 14 may be connected to a first tap terminal 41. Additionally or alternatively, the second terminal of the first transmission line 13 may be connected to a second tap terminal 42. It is further noted that the first terminal of the first transmission line 13 may be connected to a third tap terminal 43. The first terminal of the second transmission line 14 may be connected to a fourth tap terminal 44. Moreover, a source terminal of the first transistor 11 may be connected to ground. In addition to this or as an alternative, a source terminal of the second transistor 12 may be connected to ground.

As it will be explained regarding FIG. 4A, the differential amplifier further comprises a first capacitance 21, a first capacitor, wherein the first capacitance 21, the first capacitor, is inserted between the gate terminal of the first transistor 11 and the first transmission line 13 in a serial manner.

Additionally or alternatively, the differential amplifier further comprises a second capacitance 22, a second capacitor, wherein the second capacitance 22, the second capacitor, is inserted between the gate terminal of the second transistor 12 and the second transmission line 14 in a serial manner.

Furthermore, it is noted that the length of the first transmission line 13 or TL, may be between a twentieth and a tenth, for example, between a sixteenth and a fourteenth, of the respective signal wavelength. In addition to this or as an alternative, the length of the second transmission line 14 or TL, may be between a twentieth and a tenth, for example between a sixteenth and a fourteenth, of the respective signal wavelength.

For example, the length of the first transmission line 13 or TL, is at least 50 μm, for example at least 100 μm. Additionally or alternatively, the length of the second transmission line 14 or TL, may be at least 50 μm, for example at least 100 μm.

For example, the value of the first capacitance Co is between one and three times, for example between 1.5 and 2.5 times, the value of the respective parasitic gate capacitance of the first transistor 11 or $M_1$. For example, the value of the second capacitance $C_{gd}$ is between one and three times, for example between 1.5 and 2.5 times, the value of the respective parasitic gate capacitance of the second transistor 12 or $M_2$.

Furthermore, the value of the first capacitance $C_{gd}$ may be between 50 fF and 200 fF, for example between 100 fF and 150 fF, per millimeter of the length of the first transmission line 13 or TL. In addition to this or as an alternative, the value of the second capacitance $C_{gd}$ may be between 50 fF and 200 fF, for example between 100 fF and 150 fF, per millimeter of the length of the second transmission line 14 or TL.

In an example, the first transistor and the second transistor have the same properties. Additionally or alternatively, the first transmission line and the second transmission line may have the same properties. In further addition to this or as further alternative, the first capacitance and the second capacitance may have the same properties.

For example, at least one of the first transmission line and the second transmission line is replaced by appropriate high-order passives. Additionally or alternative, in the case that at least one of the first capacitance and the second capacitance is present, at least one of the corresponding series connections may for example be replaced by appropriate high-order passives.

Figure 2A:
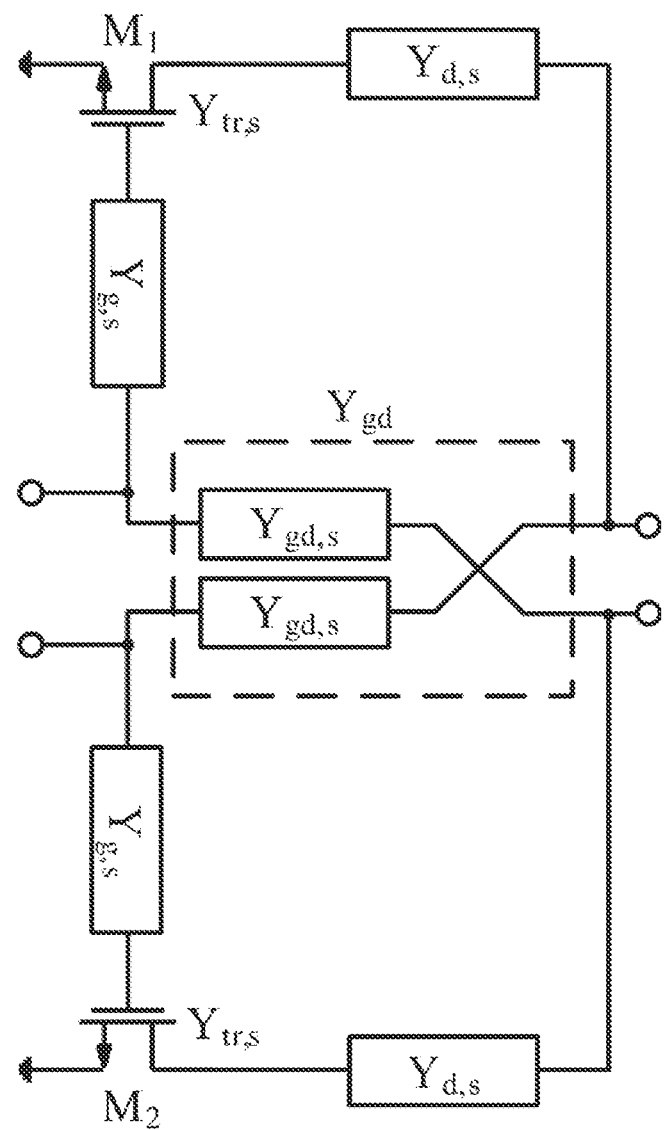
FIG. 2A illustrates a differential $G_{max}$-core, according to an example.

FIG. 2A shows a differential amplifier or $G_{max}$-core. Before the working principle of the differential $G_{max}$-core is investigated with the aid of FIG. 2A and FIG. 2B, it is remembered that $G_{max}$ denotes the enhanced gain.

In general, the present disclosure comprises a broadband gain boosting technique which can achieve the $G_{max}$ for the ultra-broad band without gain drop, thus, expanding its usage in the broad band system. Furthermore, the broad band technique is applied on the respective differential pair, whereas the conventional structures mostly rely on the single-ended configuration.

In addition to the enhanced gain $G_{max}$, it is noted that two further types of gain are of interest in the following: the maximum available gain denoted as $G_{ma}$, and the unilateral gain denoted as U.

With respect to $G_{ma}$, it is noted that the input and the output may be conjugate matched. In this context, the corresponding stability factor, denoted as $K_f$, may be greater than one. In an example, U is invariant with linear, lossless, and reciprocal passive embedding.

Again, with respect to FIG. 2A, the core is embedded by gate, drain, and cross-coupled passives. The feedback path is achieved through the cross-coupled components while the gate and drain embedding provide additional design freedom as utilized in the single-ended configuration.

Figure 2B:
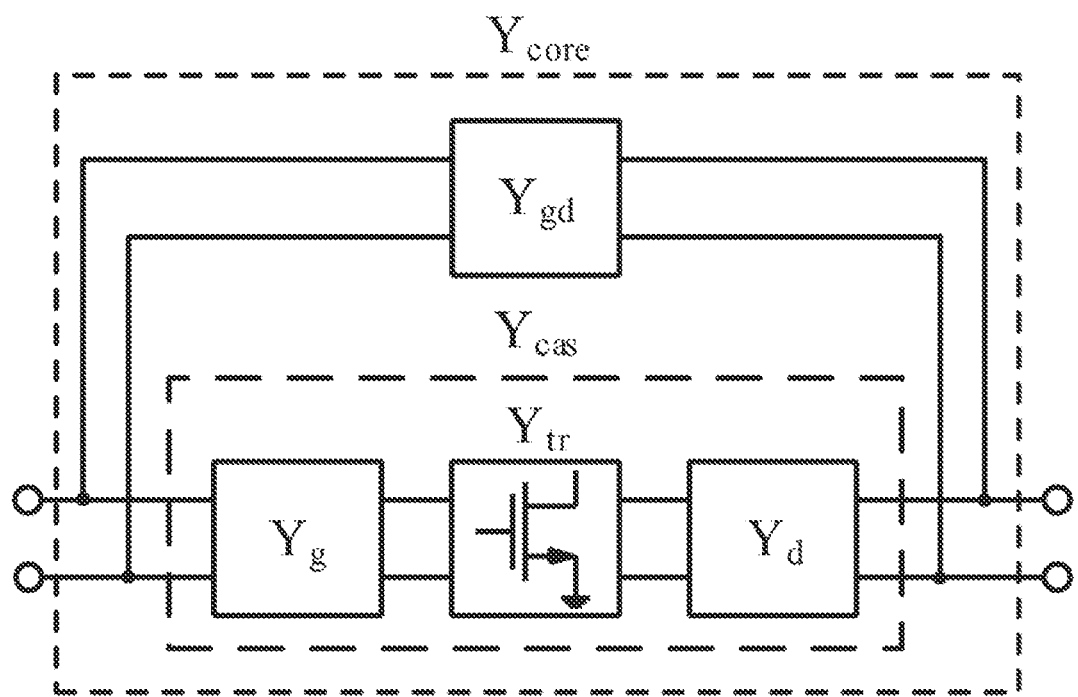
FIG. 2B shows a single-ended representation of FIG. 2A for 2-port analysis, according to an example.

The differential structure can be interpreted as a 2-port network and, hereby, simplified to an equivalent single-ended configuration in FIG. 2B, wherein each Y-parameter can be translated to:

$$Y_{tr} = \frac{Y_{tr,s}}{2}, Y_g = \frac{Y_{g,s}}{2}, Y_d = \frac{Y_{d,s}}{2}, \quad (1)$$

$$Y_{gd} = \frac{1}{2}\begin{bmatrix} Y_{gd,s,11} & -Y_{gd,s,12} \\ -Y_{gd,s,21} & Y_{gd,s,22} \end{bmatrix}$$

Compared to the single-ended configuration, its Y-parameters are scaled by half and $Y_{gd,12}$ and $Y_{gd,21}$ of the cross-coupled passive change their signs due to the cross-coupling. Given the two-port parameters of the core, required conditions to achieve the $G_{max}$ are:

$K_f=1$ $\theta=180°$, wherein $K_f$ denotes the above-mentioned stability factor and $\theta$ is a phase of a transfer parameter ratio $$\frac{Y_{core,21}}{Y_{core,12}}.$$

The equivalent expression in 2-port parameters is:

$$-G_{max} = \frac{Y_{core,21}}{Y_{core,12}}. \quad (2)$$

Along with the required $G_{max}$ conditions for each embedding component, the derivation of the maximal available gain $G_{ma}$ with respect to $K_f$ and $\theta$ indicates a direction for the broadband core design:

$$G_{ma} = \quad (3)$$
$$\frac{1}{2}\left\{Ua^2 - 2a\cos\theta(U-1) + U + \sqrt{(Ua^2 - 2a\cos\theta(U-1) + U)^2 - 4a^2}\right\},$$

wherein $a = K_f - \sqrt{K_f^2 - 1}$ and U is the above-mentioned unilateral gain of the core.

Figure 3A:
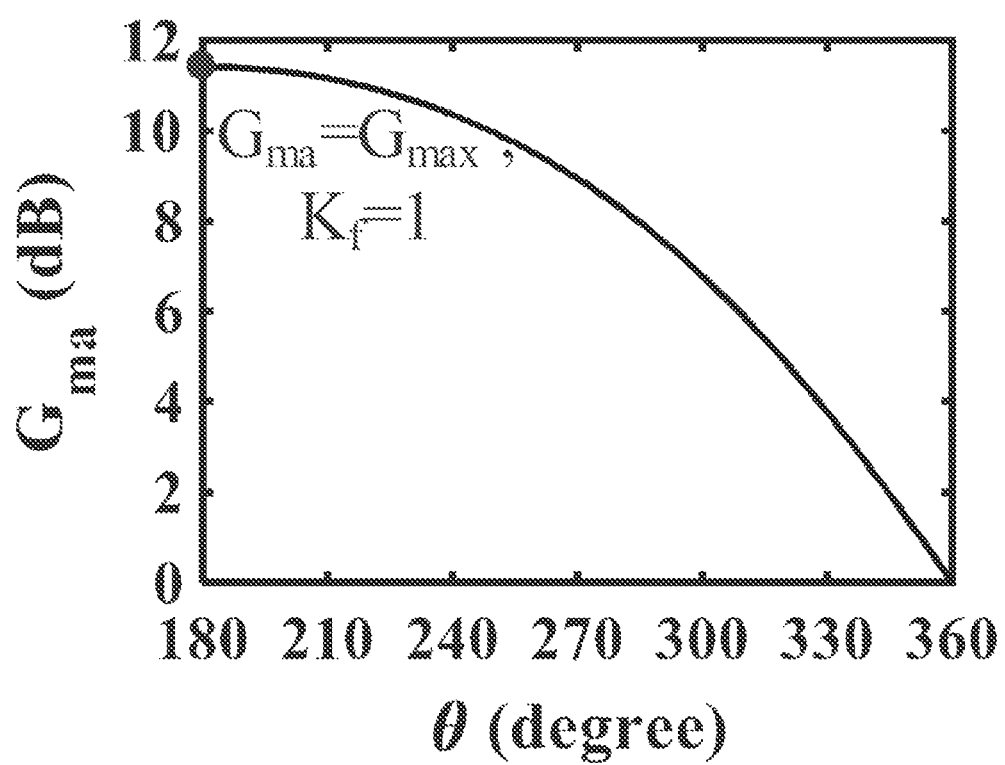
FIG. 3A shows a plot of $G_{ma}$ versus θ, according to an example.
Figure 3B:
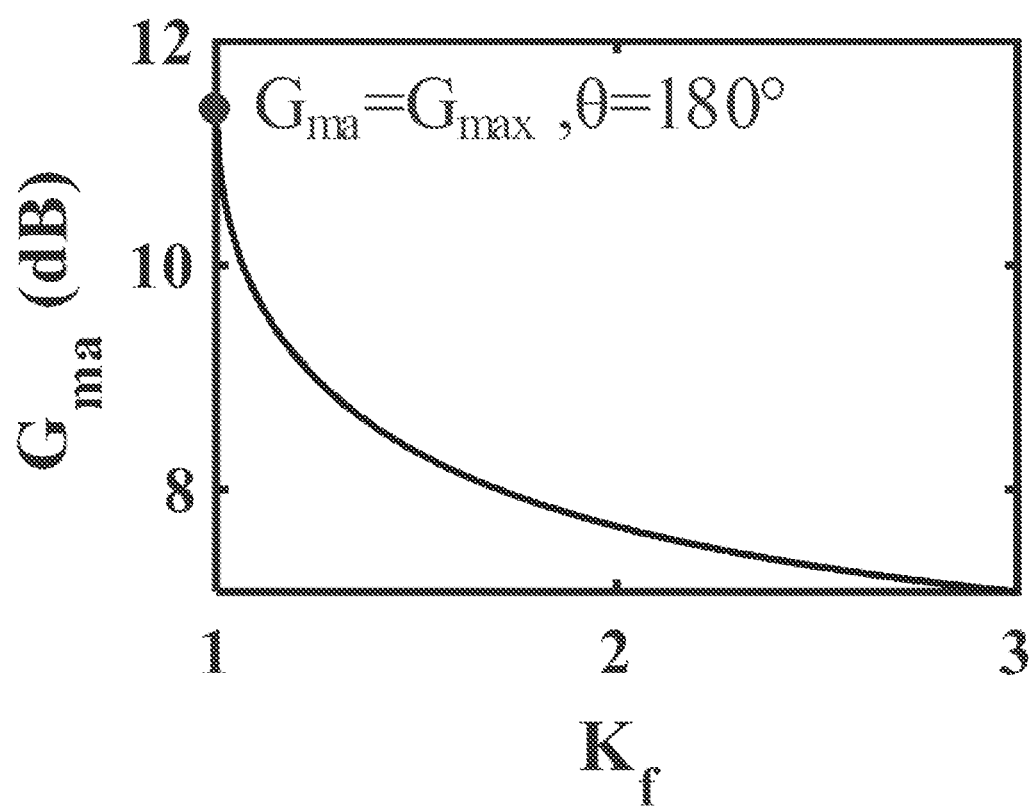
FIG. 3B shows a plot of $G_{ma}$ versus $K_f$, according to an example.

The $G_{ma}$ as a function of $K_f$ and $\theta$ in equation (3) and FIGS. 3A and 3B highlight an interesting finding that the $G_{ma}$ varies drastically with $K_f$ deviation around 1 rather than 0.

This explains extremely narrow gain peaks around the target frequency, where $K_f$ varies across 1, limiting the usage of conventional $G_{max}$-cores to the narrow band system.

The $G_{max}$-core thereby devises an embedding network that tracks $K_f=1$ condition for the frequency range of interest to avoid a $G_{ma}$ drop and to achieve a broadband operation.

Figure 4A:
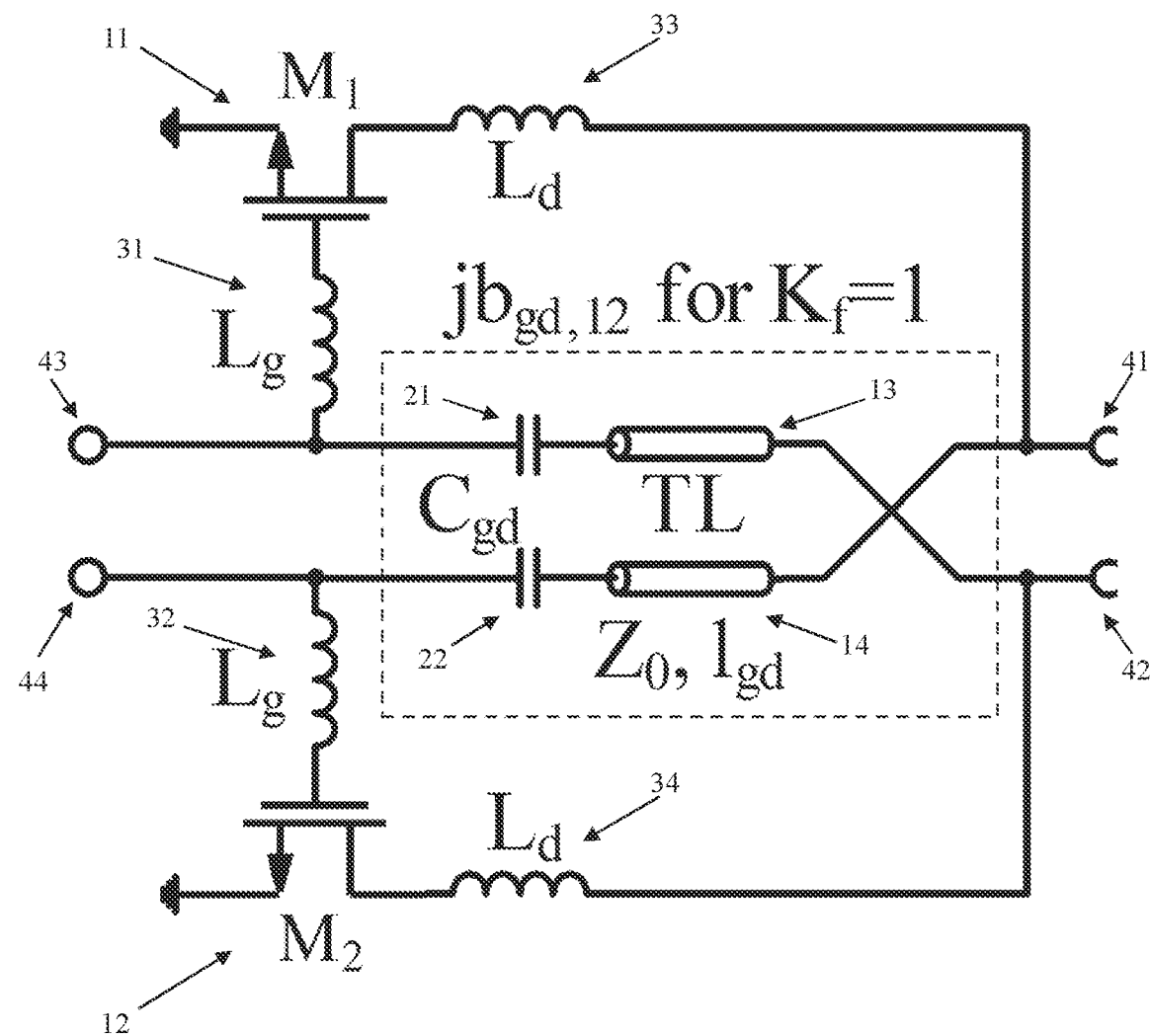
FIG. 4A shows a broadband $G_{max}$-core, according to an example.

A broadband $G_{max}$-core with embedding passives is shown in FIG. 4A. The core consists of gate inductors denoted as $L_g$, and drain inductors denoted as $L_d$, and cross-coupled components. In this case, the embedding passives are implemented in two steps.

The circuit diagram according to FIG. 4A, for example the depicted connections thereof, can be summarized as follows: As already stated regarding FIG. 1 above, the circuit of FIG. 4A comprises a first transistor 11, a second transistor 12, a first capacitance 21, for example a first capacitor with value $C_{gd}$, and a second capacitance 22, for example a second capacitor with value $C_{gd}$. For example, the first capacitance 21 and the second capacitance 22 have the same value.

Furthermore, in accordance with FIG. 4A, the circuit may comprise a first inductance 31, for example a first inductor with value $L_g$, a second inductance 32, for example a second inductor with value $L_g$, a third inductance 33, for example a third inductor with value $L_d$, and fourth inductance 34, for example a fourth inductor with value $L_d$.

In this exemplary case of FIG. 4A, a gate terminal of the first transistor 11 is connected to a first terminal of the first inductance 31, whereas a second terminal of the first inductance 31 is connected to a first terminal of the first capacitance 21. A second terminal of the first capacitance 21 is connected to a first terminal of the first transmission line 13, whereas a second terminal of the first transmission line 13 is connected to a first terminal of the fourth inductance 34.

Furthermore, a second terminal of the fourth inductance 34 is connected to a drain terminal of the second transistor 12.

Moreover, a gate terminal of the second transistor 12 is connected to a first terminal of the second inductance 32, whereas a second terminal of the second inductance 32 is connected to a first terminal of the second capacitance 22. A second terminal of the second capacitance 22 is connected to a first terminal of the second transmission line 14, whereas a second terminal of the second transmission line 14 is connected to a first terminal of the third inductance 33. Furthermore, a second terminal of the third inductance 33 is connected to a drain terminal of the first transistor 11.

$$Y_{gd} = \frac{1}{2}\begin{bmatrix} j\omega C_{gd} + \frac{jZ_0\tan(\beta l_{gd})\omega^2 C_{gd}^2}{1-Z_0\tan(\beta l_{gd})\omega c_{gd}} & \frac{j\omega C_{gd}}{\cos(\beta l_{gd})(1-Z_0\tan(\beta l_{gd})\omega C_{gd})} \\ \frac{j\omega C_{gd}}{\cos(\beta l_{gd})(1-Z_0\tan(\beta l_{gd})\omega C_{gd})} & \frac{1}{jZ_0\tan(\beta l_{gd})} + \frac{j}{Z_0\sin(\beta l_{gd})(1-Z_0\tan(\beta l_{gd})\omega C_{gd})} \end{bmatrix}, \quad (6)$$

It is noted that the second terminal of the second transmission line 14 may be connected to a first tap terminal 41. The second terminal of the first transmission line 13 may be connected to a second tap terminal 42. Furthermore, the first terminal of the first capacitance 21 may be connected to a third tap terminal 43. The first terminal of the second capacitance 22 may be connected to a fourth tap terminal 44. Moreover, a source terminal of the first transistor 11 may be connected to ground. In addition to this or as an alternative, a source terminal of the second transistor 12 may be connected to ground.

For example, alternative embodiments of the circuit according to FIG. 4A are deduced from the embodiment depicted in FIG. 4A by shorting at least one, for example at least two, of the inductances 31, 32, 33, 34. In this context, shorting may be performed in a symmetric manner, i.e. each of the first and the second inductance 31, 32, which can also be called "gate inductances," is shorted. Additionally or alternatively, each of the third and the fourth inductances 33, 34, which can also be called "drain inductances," is shorted.

First, the $L_g$, $L_d$, and $Y_{gd}$ are designed to satisfy the $G_{max}$ conditions at the center frequency. Second, the cross-coupled passive $Y_{gd}$ is manipulated such that the required Y-parameter values for $K_f=1$ can be tracked for broad frequency range.

Furthermore, the required $Y_{gd}$ ($b_{tar}$) satisfying the $K_f=1$ condition can be calculated from:

$$K_f = \frac{2g_{eq,11}g_{eq,22} - Re\{Y_{eq,21}Y_{eq,12}\}}{|Y_{eq,21}Y_{eq,12}|} = 1, \quad (4)$$

wherein $Y_x=g_x+jb_x$.

By solving the above-mentioned equation (4):

$$b_{tar} = Im(Y_{gd,12}) = b_{gd,12} = b_{gd,21} = \frac{-E \pm \sqrt{E^2-4DF}}{2D}, \quad (5)$$

$D=g_{cas,12}^2+g_{cas,21}^2-4g_{cas,11}g_{cas,22}+2g_{cas,21}g_{cas,12}$,
$E=2g_{cas,12}^2b_{cas,21}+2g_{cas,21}^2b_{cas,12}+(2g_{cas,21}g_{cas,12}-4g_{cas,11}g_{cas,22})(b_{cas,21}+g_{cas,12}), F=g_{cas,12}^2b_{cas,21}^2+g_{cas,21}^2b_{cas,12}^2-4g_{cas,11}g_{cas,22}+4g_{cas,11}g_{cas,22}g_{cas,21}g_{cas,12}-2b_{cas,21}b_{cas,12}(2g_{cas,11}g_{cas,22}-g_{cas,21}g_{cas,12})$.

In this context according to equation (5) above, it is noted that terms comprising $g_{cas}$ and/or bias are defined by the above-mentioned formula $Y_x=g_x+jb_x$. Additionally or alternatively, the definition may be based on the block denoted as $Y_{cas}$ in FIG. 2B.

Figure 4B:
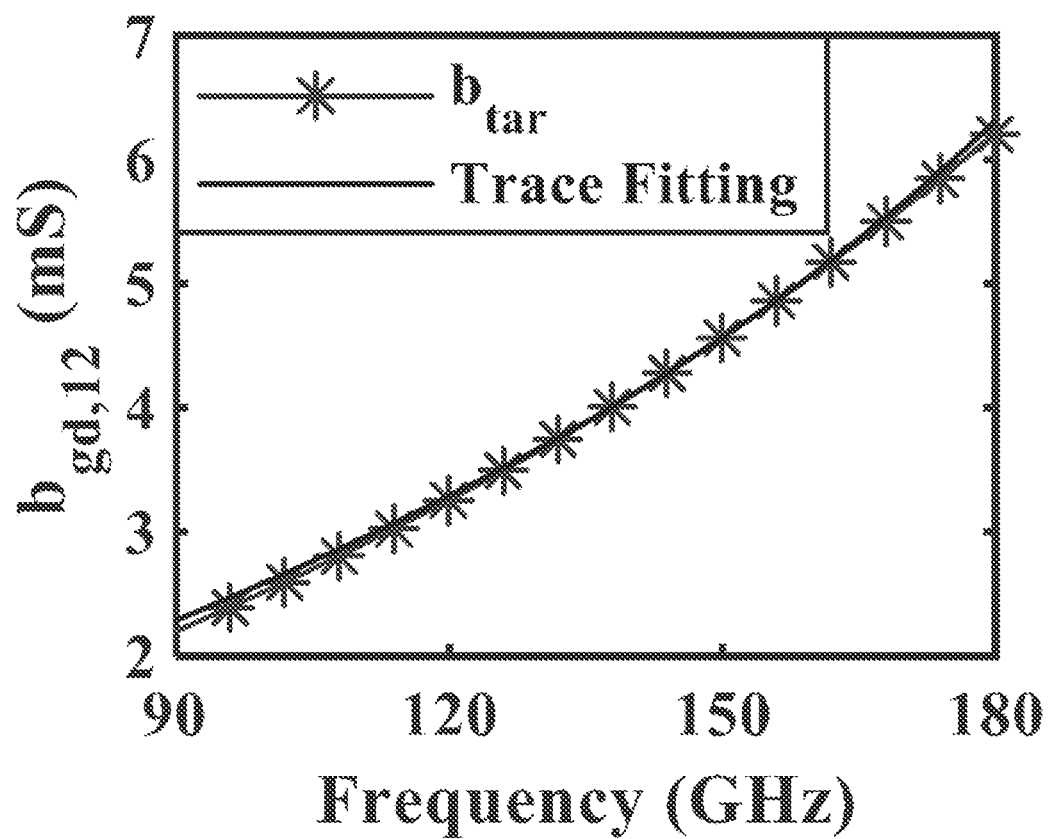
FIG. 4B illustrates trace fitting in the context of FIG. 4A, according to an example.

As the $b_{tar}$ from equation (5) in FIG. 4B exhibits positive value, the cross-coupled embedding should be capacitive and requires a series capacitor. In addition, to increase the order of freedom on the cross-coupled passive and to track the $b_{tar}$ across the frequency, a transmission line (TL) is connected in series with the capacitor Co as shown in FIG. 4A, which forms a $Y_{gd}$:

wherein $Z_0$ is a characteristic impedance of the transmission line TL, $\beta$ is a phase constant and $l_{gd}$ is a length of the transmission line TL.

Moreover, to satisfy the $G_{max}$ condition at the center frequency, the $C_{gd}$ in equation (6) should satisfy the following equation:

$$C_{gd} = \frac{b_{tar,center} \cdot \cos(\beta_{center}l_{gd})}{2\pi f_0(0.5 + b_{tar,center} \cdot Z_0\sin(\beta_{center}l_{gd}))}, \quad (7)$$

wherein $b_{tar,center}$ and $\beta_{center}$ stand for $b_{tar}$ and $\beta$ at the center frequency $f_0$.

The required $Z_0$ and $l_{gd}$ for the broadband operation can exemplarily be driven with the help of least squares method:

$$\min_{Z_0,l_{gd}} \sum_{f_l}^{f_h}(b_{tar}-b_{gd,12})^2, \quad (8)$$

wherein $f_l<f_0<f_h$ and $f_l$ and $f_h$ are targeted boundaries at the lowest and the highest frequency, respectively.

Furthermore, the respective trace fitting with equation (8) in FIG. 4B shows that the targeted $b_{tar}$ can be successfully approximated with appropriate passive models, for example with the aid of the series connection of $C_{gd}$ and TL, resulting in a near 1 $K_f$ for broad frequency range.

Figure 5A:
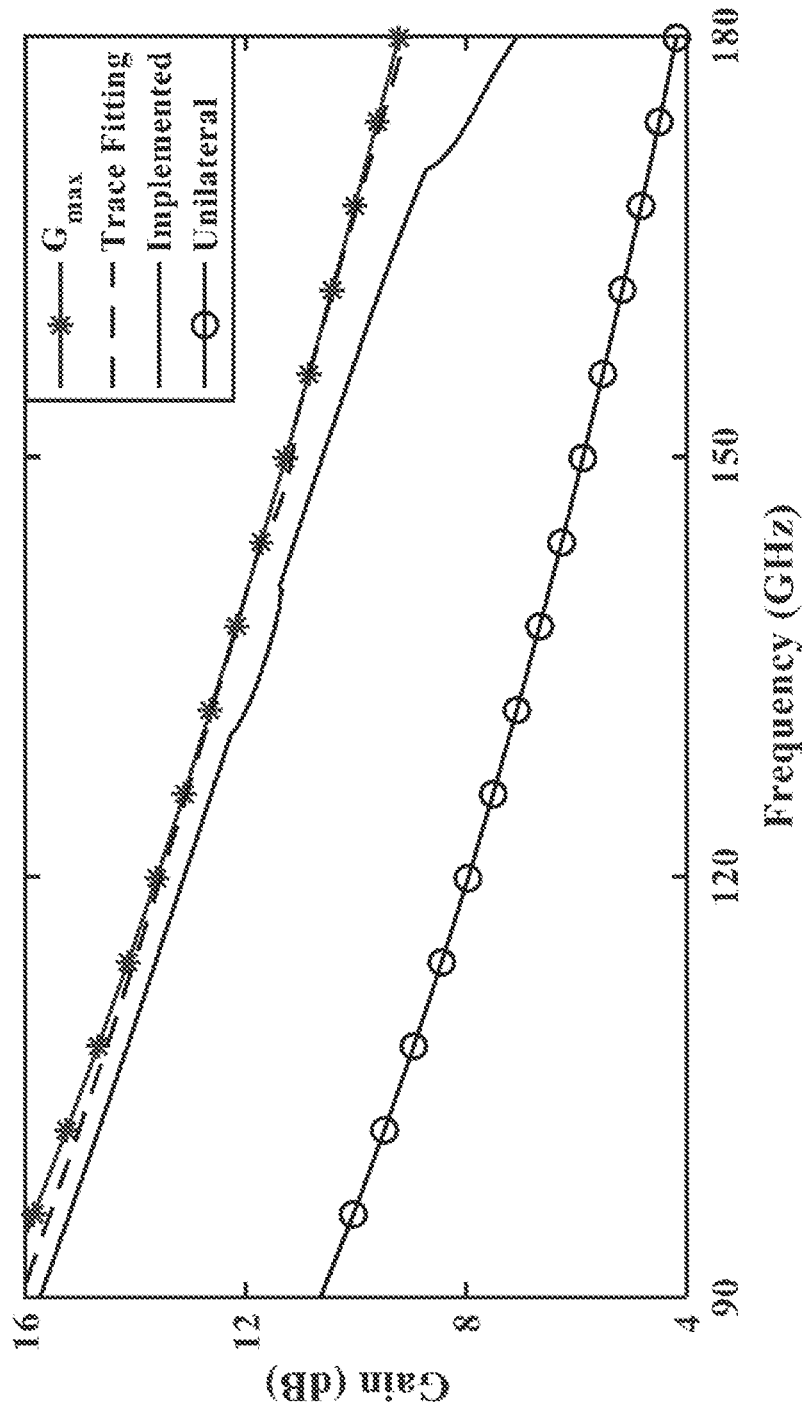
FIG. 5A shows a plot of gain (versus frequency) of the implemented core of FIG. 4A, according to an example.
Figure 5B:
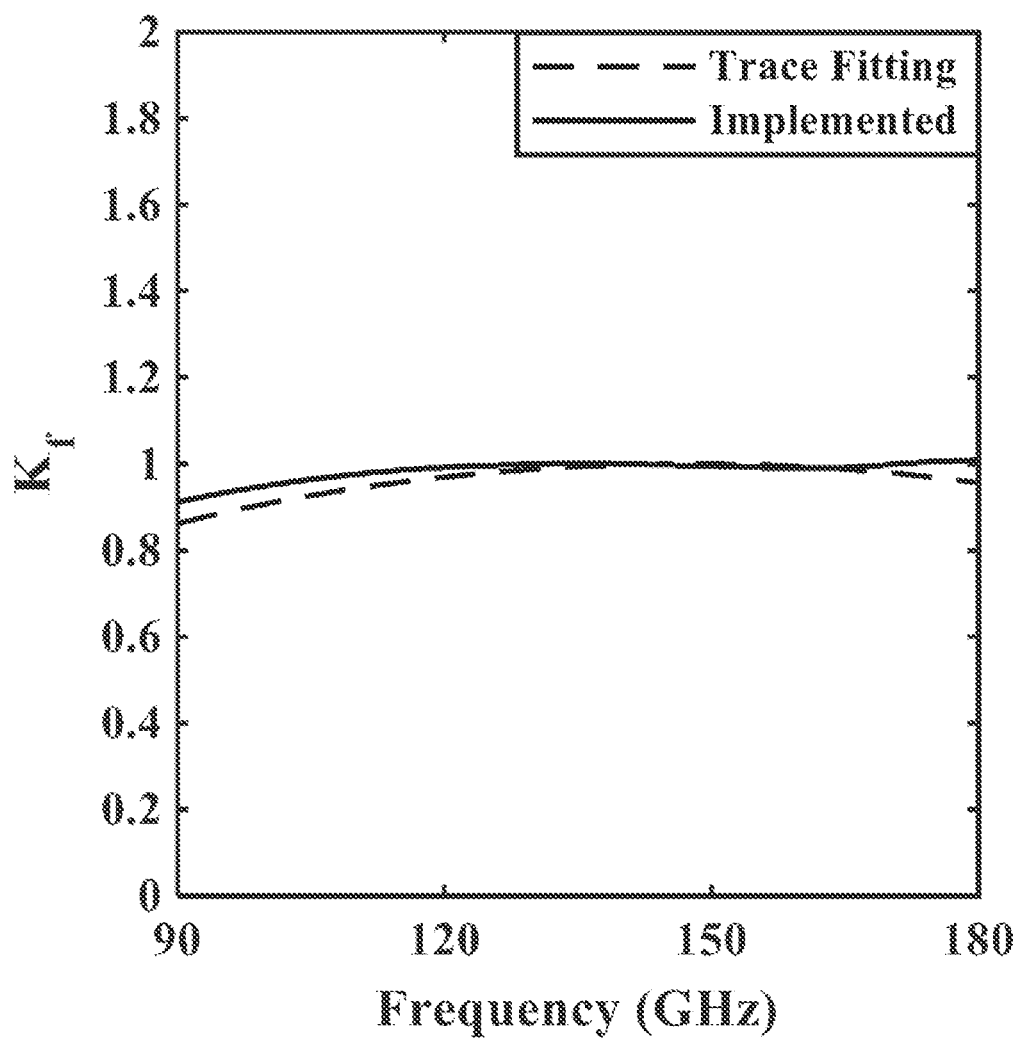
FIG. 5B shows a plot of stability (over frequency) of the implanted core of FIG. 4A, according to an example.
Figure 5C:
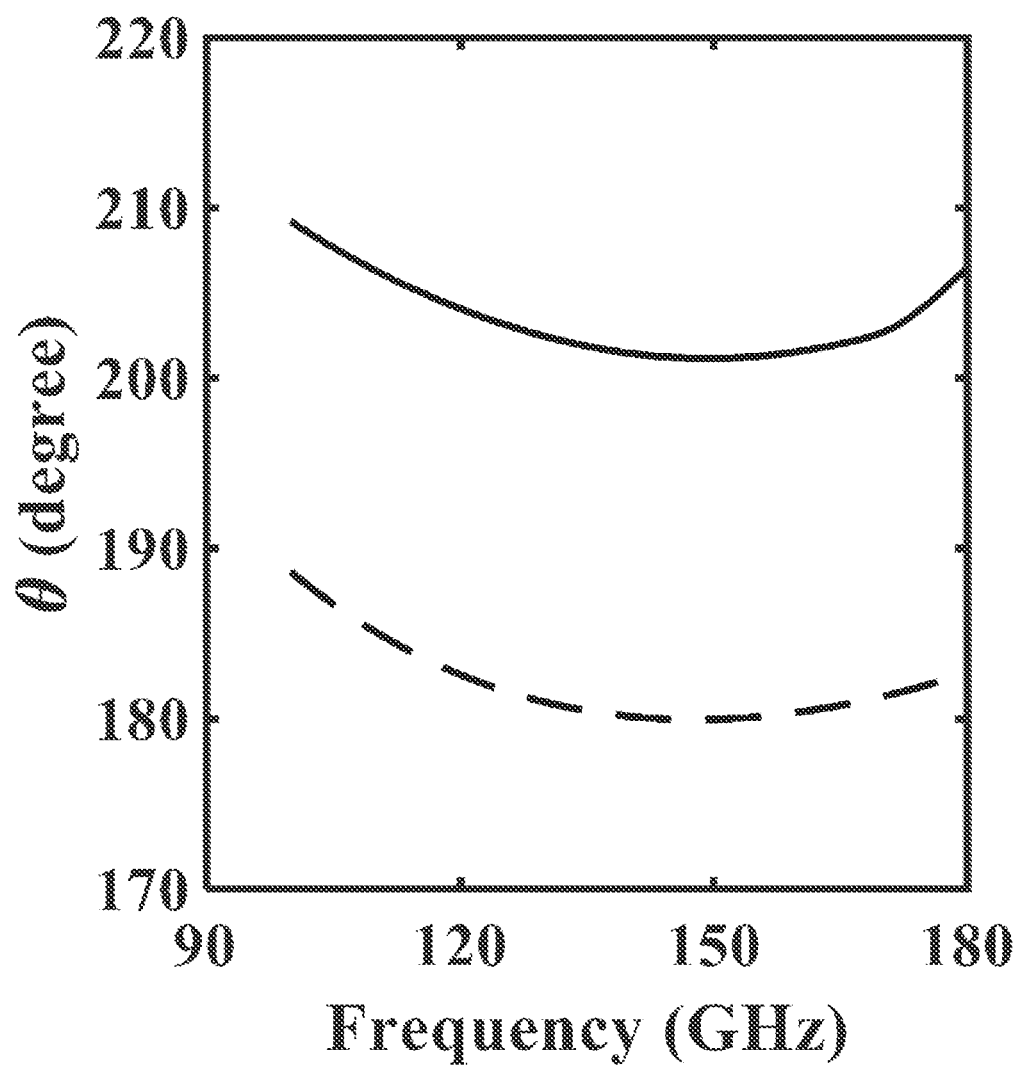
FIG. 5C shows a plot of θ (versus frequency) of the implemented core according to FIG. 4A, according to an example.

Moreover, the post-layout simulation results presented by FIG. 5A, FIG. 5B, and FIG. 5C prove that $K_f=1$ condition is sustained for more than 80 GHz at 144 GHz, while its $G_{ma}$ tightly follows $G_{max}$ within 1 dB deviation which is mainly due to the passive losses. The θ deviation in FIG. 5C is less than 30° which has a minor impact on the gain as described in FIG. 3A.

With respect to FIG. 5A, it is further noted that the depicted "$G_{max}$"-curve can be understood as a theoretical target curve, whereas the "Trace Fitting"-curve can be interpreted as a curve with ideal lumped components. Furthermore, the "Implemented"-curve of FIG. 5A can be based on a layout extracted, whereas the "Unilateral"-curve can be seen as a curve based on unilateral gain.

Furthermore, with respect to FIG. 5B and FIG. 5C, it is noted that these figures show the above-mentioned "Trace Fitting"-curve and "Implemented"-curve in the context of the corresponding stability factor and the above-mentioned θ deviation.

It can be summarized that the present disclosure allows for achieving enhanced gain ($G_{max}$) of the amplifier or transistor, for broad bandwidth. Based on the finding that a stability factor ($K_f$) deviation around 1 highly degrades a maximum available gain ($G_{ma}$) and incurs gain drop around the center frequency, the $G_{max}$-core devises embedding passives in differential configuration which can sustain the $K_f=1$ condition for broad frequency range. The core tracks the theoretical $G_{max}$ more than 80 GHz at 144 GHz, enabling the usage of the $G_{max}$-core in ultra-broadband applications.

Accordingly, with the aid of the present disclosure, several limitations of conventional gain-boosting cores can be alleviated. For example, such limitations are:

Some conventional cores are achieved for the single frequency with extremely narrow bandwidth due to its sharp gain peaking nature.

Some (dual-peaking) conventional cores expand the bandwidth with two gain peaks placed apart while revealing few dBs of gain drop between the gain peaks, still suffering from the gain-bandwidth trade off.

Most conventional cores are achieved not in a differential configuration but only in a single-ended one.

For instance, by having overcome the limitations, the disclosure can be utilized in the high frequency front-end where both the high gain and broad bandwidth should be achieved such as PAs and LNAs in transceivers for communications and radars above 100 GHz.

For example, the disclosure is implemented in 28 nm CMOS technology.

Figure 6:
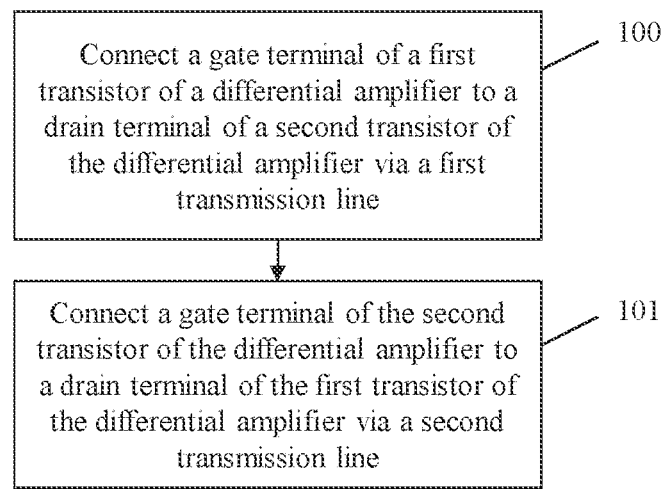
FIG. 6 shows a flow chart of a method, according to an example.

Finally, FIG. 6 shows a flow chart of a method for enhancing gain ($G_{max}$) of a differential amplifier. In a first step 100, a gate terminal of a first transistor, such as the above-mentioned transistors 11 and $M_1$, of the differential amplifier is connected to a drain terminal of a second transistor, such as the above-mentioned transistors 12 and $M_2$, of the differential amplifier via a first transmission line, such as the above-mentioned transmission lines 13 and TL.

Then, in a second step 101, a gate terminal of the second transistor of the differential amplifier is connected to a drain terminal of the first transistor of the differential amplifier via a second transmission line, such as the above-mentioned transmission lines 14 and TL.

For example, the method further comprises the step of inserting a first capacitance, such as the above-mentioned capacitance $C_{gd}$, a first capacitor, between the gate terminal of the first transistor and the first transmission line in a serial manner. In addition to this or as an alternative, the method may comprise the step of inserting a second capacitance, such as $C_{gd}$ mentioned above, a second capacitor, between the gate terminal of the second transistor and the second transmission line in a serial manner.

Furthermore, the length of the first transmission line may be between a twentieth and a tenth, for example between a sixteenth and a fourteenth, of the corresponding signal wavelength with respect to the differential amplifier. Additionally or alternatively, the length of the second transmission line may be between a twentieth and a tenth, for example between a sixteenth and a fourteenth, of the corresponding signal wavelength with respect to the differential amplifier.

It is further noted that the length of the first transmission line may be at least 50 μm, for example at least 100 μm. Additionally or alternatively, the length of the second transmission line may be at least 50 μm, for example at least 100 μm.

For example, the value of the first capacitance is between one and three times, for example between 1.5 and 2.5 times, the value of the respective parasitic gate capacitance of the first transistor of the differential amplifier.

For example, the value of the second capacitance is between one and three times, for example between 1.5 and 2.5 times, the value of the respective parasitic gate capacitance of the second transistor of the differential amplifier.

Furthermore, the value of the first capacitance may be between 50 fF and 200 fF, for example between 100 fF and 150 fF, per millimeter of the length of the first transmission line. Additionally or alternatively, the value of the second capacitance may be between 50 fF and 200 fF, for example between 100 fF and 150 fF, per millimeter of the length of the second transmission line.

For example, the method further comprises the step of tracking the corresponding stability factor ($K_f$) with respect to the differential amplifier.

Moreover, the method may further comprise the step of configuring the corresponding coupling between the gate terminal of the first transistor of the differential amplifier and the drain terminal of the second transistor of the differential amplifier such that the corresponding stability factor ($K_f$) with respect to the differential amplifier is constantly nearly one, constantly one, more constantly nearly one over a desired frequency range, most constantly one over a desired frequency range, for example, in the case of tracking the corresponding stability factor ($K_f$), on the basis of the tracked stability factor.

In addition to this or as an alternative, the method may comprise the step of configuring the corresponding coupling between the gate terminal of the second transistor of the differential amplifier and the drain terminal of the first transistor of the differential amplifier such that the corresponding stability factor ($K_f$) with respect to the differential amplifier is constantly nearly one, constantly one, more constantly nearly one over a desired frequency range, most constantly one over a desired frequency range, for example, in the case of tracking the corresponding stability factor ($K_f$), on the basis of the tracked stability factor.

While various embodiments of the present disclosure have been described above, it should be understood that they have been presented by way of example only, and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

Although the disclosure has been illustrated and described with respect to one or more implementations, equivalent alterations and modifications will occur to others skilled in the art upon the reading and understanding of this specification and the annexed drawings. In addition, while a particular feature of the disclosure may have been disclosed with respect to only one of several implementations, such feature may be combined with one or more other features of the other implementations as may be desired and advantageous for any given or particular application.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A differential amplifier comprising:
a first single-ended amplifier comprising a first terminal and a second terminal;
a second single-ended amplifier comprising a first terminal and a second terminal;
a first transmission line; and
a second transmission line,
wherein the first terminal of the first single-ended amplifier is connected to the second terminal of the second single-ended amplifier via a first series connection of the first transmission line, a first capacitance, and a first inductance, and
wherein the first terminal of the second single-ended amplifier is connected to the second terminal of the first single-ended amplifier via a second series connection of the second transmission line, a second capacitance, and a second inductance.

2. The differential amplifier according to claim 1,
wherein a value of the first capacitance is between 50 femtofarad and 200 femtofarad or between 100 femtofarad and 150 femtofarad, per millimeter of a length of the first transmission line, and
wherein a value of the second capacitance is between 50 femtofarad and 200 femtofarad or between 100 femtofarad and 150 femtofarad, per millimeter of a length of the second transmission line.

3. The differential amplifier according to claim 1,
wherein a value of the first capacitance is between one and three times or between 1.5 and 2.5 times a value of a first-terminal-to-second-terminal capacitance of the first single-ended amplifier, and
wherein a value of the second capacitance is between one and three times or between 1.5 and 2.5 times a value of a first-terminal-to-second-terminal capacitance of the second single-ended amplifier.

4. The differential amplifier according to claim 1, wherein:
a third passive element network is further included as part of the first series connection; and
a fourth passive element network is further included as part of the second series connection.

5. The differential amplifier according to claim 4,
wherein the third passive element network comprises a third inductance, and
wherein the fourth passive element network comprises a fourth inductance.

6. The differential amplifier according to claim 1,
wherein a length of the first transmission line is at least 50 micrometers or at least 100 micrometers, and
wherein a length of the second transmission line is at least 50 micrometers or at least 100 micrometers.

7. The differential amplifier according to claim 1,
wherein the first single-ended amplifier comprises a first transistor, wherein the first terminal of the first single-ended amplifier is connected to a gate terminal of the first transistor and the second terminal of the first single-ended amplifier is connected to a drain terminal of the first transistor, and
wherein the second single-ended amplifier comprises a second transistor, wherein the first terminal of the second single-ended amplifier is connected to a gate terminal of the second transistor and the second terminal of the second single-ended amplifier is connected to a drain terminal of the second transistor.

8. A method for gain adjustment of a differential amplifier, the method comprising:
providing a first single-ended amplifier comprising a first terminal and a second terminal, a second single-ended amplifier comprising a first terminal and a second terminal, a first transmission line, and a second transmission line,
connecting the first terminal of the first single-ended amplifier to the second terminal of the second single-ended amplifier via a first series connection of the first transmission line, a first capacitance, and a first inductance, and
connecting the first terminal of the second single-ended amplifier to the second terminal of the first single-ended amplifier via a second series connection of the second transmission line, a second capacitance, and a second inductance.

9. The method according to claim 8, further comprising tracking a stability factor of the differential amplifier.

10. The method according to claim 8, further comprising:
configuring a coupling between the first terminal of the first single-ended amplifier and the second terminal of the second single-ended amplifier such that a stability factor of the differential amplifier is nearly equal to one; and
configuring a coupling between the first terminal of the second single-ended amplifier and the second terminal of the first single-ended amplifier such that a corresponding stability factor of the differential amplifier is nearly equal to one.

11. The method according to claim 8, further comprising:
using the differential amplifier to amplify a signal having a wavelength,
wherein a length of the first transmission line is between a twentieth and a quarter, or between a fifteenth and a sixth, of the wavelength, and
wherein a length of the second transmission line is between a twentieth and a quarter, or between a fifteenth and a sixth, of the wavelength.

* * * * *